United States Patent [19]

Adler

[11] Patent Number: 4,511,026

[45] Date of Patent: Apr. 16, 1985

[54] APPARATUS FOR THE STORAGE AND MECHANICAL TRANSFER OF STOCK OR MATRIX CAPACITORS

[75] Inventor: Arno Adler, Bagnolet, France

[73] Assignee: L.C.C.-C.I.C.E.-Compagnie Europeenne de Composants Electroniques, Bagnolet, France

[21] Appl. No.: 454,391

[22] Filed: Dec. 29, 1982

[30] Foreign Application Priority Data

Dec. 31, 1981 [FR] France ................. 81 24582

[51] Int. Cl.³ .............................................. B65G 37/00
[52] U.S. Cl. .................................... 198/469; 198/475; 198/663
[58] Field of Search ............... 198/663, 625, 475, 469, 198/470, 608

[56] References Cited

U.S. PATENT DOCUMENTS

| | | | |
|---|---|---|---|
| 1,646,907 | 8/1927 | Roderburg | 198/663 |
| 1,984,659 | 12/1934 | Simmons et al. | 198/625 |
| 3,168,183 | 2/1965 | Copper | 198/625 |
| 3,308,930 | 3/1967 | DeFrancisci | 198/625 |
| 3,313,398 | 4/1967 | Andrews | 198/663 |
| 3,614,561 | 10/1971 | Behn | 29/25.42 |
| 3,670,378 | 6/1972 | Behn et al. | 29/25.42 |
| 3,728,765 | 4/1973 | Behn et al. | 29/26.42 |

FOREIGN PATENT DOCUMENTS 2144635 2/1973 France.
2461665 2/1981 France.

Primary Examiner—Joseph E. Valenza
Assistant Examiner—Kyle E. Shane
Attorney, Agent, or Firm—Pollock, Vande Sande & Priddy

[57] ABSTRACT

The present invention relates to an apparatus for the storage and mechanical transfer of stock or matrix capacitors in the form of substantially parallelepipedal bars obtained by stacking films of metalized plastic material on a wheel of large diameter. According to the invention, the apparatus comprises a plurality of endless screws arranged along an arc having a diameter substantially matching that of the parallelepipedal bars after being cut on the wheel, each screw terminating in a circular groove parallel to the transfer direction. The apparatus is employed for the transfer of stock or matrix capacitors towards a station to be cut into unitary capacitors.

1 Claim, 4 Drawing Figures

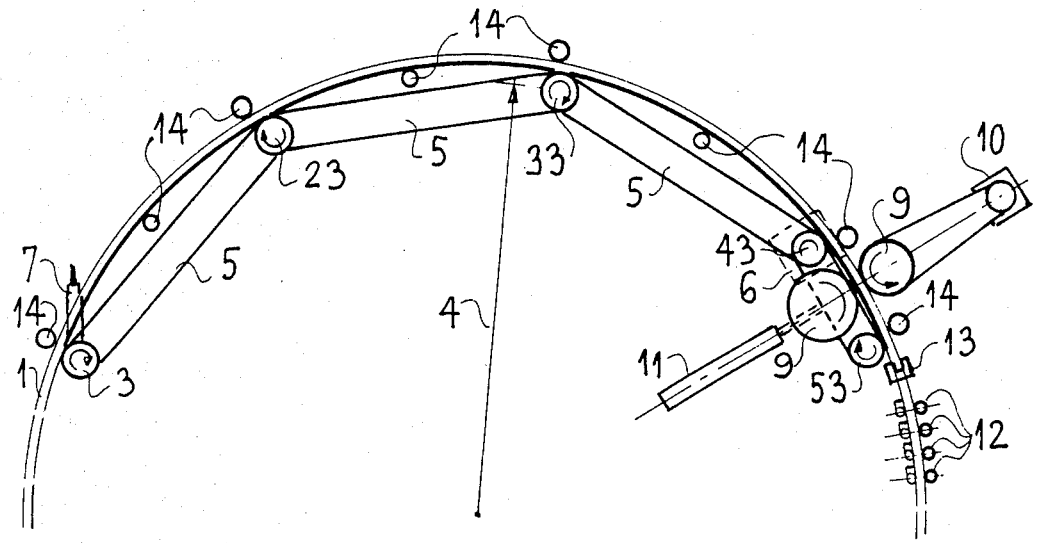
FIG_1
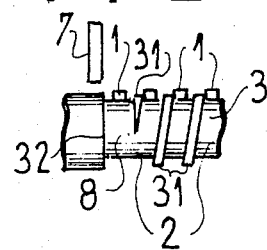
FIG_2
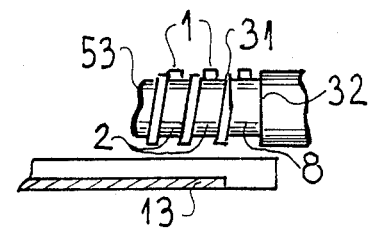
FIG_3
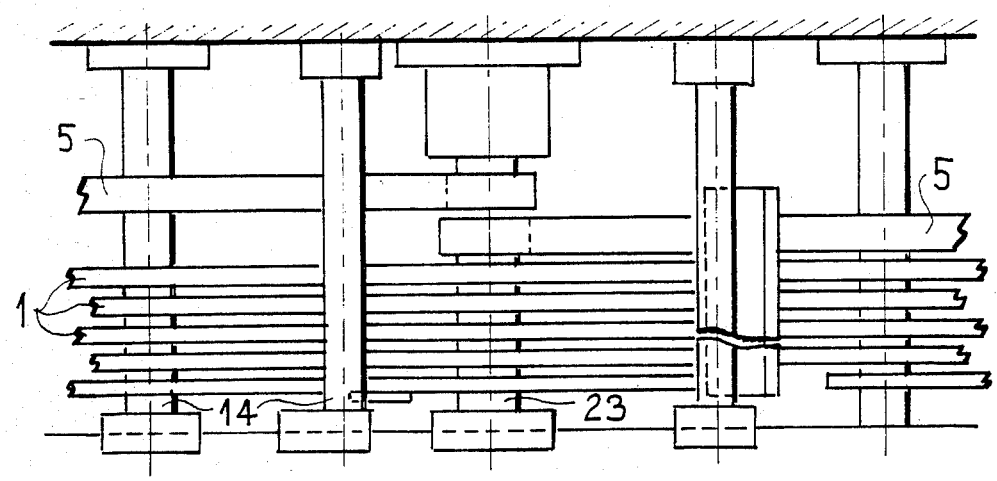
FIG_4

APPARATUS FOR THE STORAGE AND MECHANICAL TRANSFER OF STOCK OR MATRIX CAPACITORS

The present invention relates to an apparatus for storage and mechanical transfer of stock or "matrix" capacitors in the form of substantially parallelepipedal bars, the transfer being performed parallel to one of the sides of the parallelepiped.

BACKGROUND OF THE INVENTION

It is known, for example from French Pat. No. 903,040, to produce capacitors by stacking films of metalized plastics material in flat form or on a wheel of large diameter. After establishing lateral connections of these stacks of parallelepipedal form, they are cut into unitary capacitors by radial separation. These parallelepipedal bars formed in this manner may have a length greater than one meter and the problem arises as to the handling of them automatically for the purpose of separation, in particular in the case of those which have a natural or inherent curvature caused by winding on the wheel.

It is known that use may be made of belt or cloth conveyors for storage and transfer of devices of this nature. However, these known conveyors have the disadvantage that they do not match the shape of the stack, thereby causing deterioration deleterious to the capacitors. In particular, it is observed that movement in the flat stage of these capacitor bars obtained by winding onto a wheel of large diameter causes separation of the surface layers at the level of the lateral connections formed by application of molten metal. Moreover, these cloth conveyors require considerable space since the bars should be arranged one behind another so that they may be cut one after another upon leaving the conveyor.

SUMMARY OF THE INVENTION

A device for storage and mechanical transfer of stock or matrix capacitors in accordance with the invention makes it possible to overcome these disadvantages. To this end, the invention is characterized in that it comprises means for supporting a plurality of parallelepipedal bars positioned parallel to each other, means for selecting a bar for transfer after the completed transfer of the preceding bar, means for advancing the bar to assure its transfer, and means for selecting a bar comprising at least one endless screw having a pitch greater than the width of the bar which penetrates into the groove separating the threads of the screw, wherein screw rotation provides the lateral displacement of the bar when the bar, which is to be cut, has been transferred.

According to a preferred embodiment, the device of the invention is characterized in that it makes use of a plurality of endless screws or worm screws such as described above, which have synchronized rotations. For example, this synchronization may be provided by interlinkage between the different screws by means of toothed belts controlled or driven by a motor. This plurality of endless screws then plays a dual function of means for supporting the bars and of means for selection of a bar which is to be transferred, each of these means however equally being able to comprise other complementary devices. These endless screws are preferably positioned along an arc corresponding substantially to the curvature of the bars if these originate from matrix capacitors obtained by winding on a wheel of large diameter. The device of the invention equally comprises a stop situated at one of the extremities of the array of endless screws supporting the bars, said stop making it possible to position the start of these bars uniformly. It equally comprises means for detecting the end of the bar during its transfer, which means generate an activating signal fed to the motor in such a manner as to position another bar which is to be transferred, by simultaneous rotation of the endless screws by one step.

According to another embodiment, each endless screw terminates in a flange parallel to the direction of transfer, the screw-thread of the screw terminating before the flange or collar in such a manner as to form a groove parallel to the transfer direction.

BRIEF DESCRIPTION OF THE DRAWINGS

The invention will be better understood from the following non-limiting examples, described in conjunction with the accompanying drawings, in which:

FIG. 1 illustrates an overall view of one embodiment of the device according to the invention, FIG. 2 illustrates a view from above the device of FIG. 1, FIG. 3 illustrates a view from above the device of FIG. 1, FIG. 4 illustrates a view from above the whole of the device of FIG. 1.

DESCRIPTION OF THE PREFERRED EMBODIMENT

Referring to FIG. 1, endless screws or worm screws such as 3, 23, 33, 43, 53 are positioned substantially along a circle of appropriate radius 4. These worm screws are interconnected by toothed or link belts 5 driven by a motor 6. The bars 1 which are to be stored and transferred are placed within the threads of the screws (see the following figures). Non-return guides 14 of cylindrical shape are arranged regularly along the arc having the radius 4, in such a manner as to guide the bars during storage and transfer. A pair of driving rollers 9, one being stationary and situated at the top and the second being situated at the bottom and movable by means of jack 11 allow the bar selected to be picked up and transferred. A stop 13 (shown in greater detail in FIG. 3), makes it possible to secure the bars during storage. This stop is retracted in front of the bar which is to be transferred. At the lower right-hand portion of the figure are situated movable rollers 12 forming a rolling track drawing the bar transferred towards, for example, cutting means which are not illustrated in the drawing.

FIG. 2 is a partial view from above of the apparatus of FIG. 1. The worm screw 3 comprises an uninterrupted screw-thread 31, the threads being separated by grooves 2 having a width a little greater than the width of the bars 1 of parallelepipedal cross-section, as illustrated in FIG. 2. The thread 31 terminates before reaching the collar 32 of the screw in such a manner as to form a circular groove 8 in which is located the bar 1 being transferred. The bars situated in such grooves as 2 actually have their ends blocked by the stop 13 as shown in FIGS. 1 and 3. In this figure, the screw 53 has the same structure as the screw 3. The bar transferred circulates in the groove 8 while bearing on the collar 32 and the extremity of the screw-thread 31, groove 8 being circular. The stop 13 terminates substantially at the level of the end of screw-thread 31, so that the bar 1 being transferred which is situated farthest to the right in FIG. 3, is not impeded by this stop 13.

The operation of this device is the following. A plurality of bars 1 is loaded manually into the corresponding grooves 2 of the worm screws 3, 23, 33, 43 and 53, one bar only being situated in each groove. Under the action of an external driving means, not illustrated in the drawings, the driving rollers 9 pick up the bar 1 situated in the circular groove 8 and draw the same towards severing means not illustrated in the drawings. The pick up 7 situated above the screw 3 closest to the circular groove 8 detects the end of the bar present in this circular groove. The distance separating the screw 3 from the screw 53 being known on the one hand, as is the speed of rotation of the driving rollers 9 on the other hand, the period between the passing of the end of the bar into the circular groove 8 above the pick up 7 and the bar end leaving screw 53 is thus known. The pick up 7 consequently generates a signal delayed by this known or predetermined value at the motor 6 which upon receiving said signal causes a 360° rotation of all of the screws 3, 23, 33, 43 and 53. Consequently, the bar which had been present in the groove 2 adjacent to the circular groove 8 is then transferred into the same and its transfer towards the cutting means is performed like that of the preceding bar.

FIG. 4 illustrates a partial view from above the device of FIG. 1. In this figure, the same elements as those of the preceding figures bear the same references. The assemblies such as 14 which enable securing and guiding the parallelepipedal bars 1 will be noted in particular. In this figure, the threads of the worm screws have not been illustrated to simplify the latter. Generally speaking, it will be understood that the depth of the grooves 2 between the threads 31 will be a function of the pitch of the screw and of the length of the bars, in such a manner as to assure transfer free of lateral stresses on the bar 1.

I claim:

1. A system for conveying stock or matrix capacitors in the form of bars, the system comprising:

a plurality of threaded means arranged in an arc for supporting a plurality of parallel spaced arcuate bent bars thereon, the bars being transversely oriented with respect to the threaded means;

grooves formed in the threads of the threaded means for receiving the bars therein and retaining them in parallel spaced relation;

means for stopping longitudinal movement of all the bars except an innermost positioned bar;

means for longitudinally moving the innermost bar from an innermost thread of the threaded member to a work station;

control means for detecting longitudinal movement of the innermost bar from the innermost thread to the work station;

drive means connected to the control means for actuating the threaded means simultaneously to transfer all the remaining bars to respective immediately adjacent inward threads thus enabling cyclical operation; and roller means contacting the bars for ensuring they retain an arcuate shape as they are moved from the threaded means to the work station.

* * * * *